United States Patent [19]

Lewis

[11] 4,454,481
[45] Jun. 12, 1984

[54] SHIELDED AMPLIFIER

[75] Inventor: Harold F. Lewis, Villa Park, Calif.

[73] Assignee: Rockwell International Corporation, El Segundo, Calif.

[21] Appl. No.: 354,840

[22] Filed: Mar. 4, 1982

[51] Int. Cl.³ .............................................. H03F 3/14
[52] U.S. Cl. .................................................. 330/307
[58] Field of Search ............. 330/307, 207 R; 357/51, 357/84; 307/302

[56] References Cited

U.S. PATENT DOCUMENTS 4,079,337  3/1978  Lundgren et al. ................... 330/307

Primary Examiner—James B. Mullins
Assistant Examiner—Gene Wan
Attorney, Agent, or Firm—H. Fredrick Hamann; Daniel R. McGlynn; James F. Kirk

[57] ABSTRACT

A shielded amplifier adapted for use with an infrared detector array mounted on a focal plane and operating in a cryogenically cooled environment and adapted to receive a signal output from a high impedance signal source, the shielded amplifier being required to amplify the signal with relatively uniform gain over a predetermined bandwidth comprising a base substrate of semiconductor material, an integrated amplifier circuit means formed on the base substrate, a resistor connected for negative feedback between the output terminal and the input terminal, a conductive shield interposed between the resistor and the integrated amplifier circuit means, a first insulating means for insulating the resistor from the conductive shield, a second insulating means for insulating the conductive shield from the integrated circuit amplifier means; whereby the conductive shield is disposed to reduce stray parasitic capacitance thereby increasing the shielded amplifier uniform gain over a predetermined bandwidth.

14 Claims, 7 Drawing Figures

SHIELDED AMPLIFIER

The invention herein described was made in the course of or under a contract or subcontract thereunder, with the Department of the Army.

BACKGROUND OF THE INVENTION

1. Field of the Invention

This invention relates to a shielded amplifier particularly adapted for use with an infrared detector array mounted on a focal plane and operating in a cryogenically cooled environment.

2. Description of the Prior Art

Scanning infrared systems typically employ a detector upon which an image is focused. The detector is typically a very high impedance source capable of producing signals of a very low level. Amplifiers designed for use with infrared detector arrays must operate with very low power dissipation and in close proximity to the detector array to minimize stray parasitic capacitance. Stray parasitic capacitance has contributed to cross coupling between adjacent amplifier stages and has also limited the upper practical bandwidth of amplifiers used for this purpose. The invention shielded amplifier provides a structure particularly suited for limiting stray capacitance thereby enabling the design of a shielded amplifier having a gain and bandwidth extended beyond that achievable by prior art structures.

SUMMARY OF THE INVENTION

It is therefore, a major objective of this invention to provide a shielded amplifier adapted for use in a MOS/LSI amplifier array on an infrared focal plane.

Another objective of this invention is to interface with a signal source infrared detector having a super-high impedance resulting in high sensitivity to stray parasitic capacitance, and to bridging capacitance in parallel with the amplifiers negative feedback resistor. Another objective of the invention shielded amplifier is to provide shielding in a perimeter around and between respective shielded amplifier circuits to reduce signal cross coupling between individual amplifier circuits.

These and other objectives of the invention are realized in a shielded amplifier adapted for connection to a power source and having an input terminal and an output terminal and being referenced to a reference potential, the shielded amplifier being further adapted to receive a signal output from a high impedance signal source referenced to the reference potential, the shielded amplifier being required to amplify the signal with relatively uniform gain over a predetermined bandwidth with low audio susceptibility, and to output the amplified signal at the output terminal and wherein the bandwidth and audio susceptibility are subject to substantial degredation due to stray parasitic capacitance, the shielded amplifier comprising: a substantially planar base substrate of semiconductor material having a first surface, the input and output terminals being formed on the first surface, an integrated amplifier circuit means formed on the first surface for amplifying the signal at the input terminal and coupling the amplified signal to the output terminal, a resistor connected for negative feedback between the output terminal and the input terminal, a conductive shield formed between the resistor and the integrated amplifier circuit means, the conductive shield being electrically coupled to the reference potential, a first insulating means for electrically insulating the resistor from the conductive shield, a second insulating means for insulating the conductive shield from the integrated circuit amplifier means; wherein the conductive shield is disposed to reduce stray parasitic capacitance thereby increasing the shielding amplifier uniform gain over a predetermined bandwidth and reducing the audio susceptibility.

In a particular embodiment the conductive shield has a top and bottom surface, the first insulating means being formed as a thin layer of first insulator material on the top surface; whereby the thin layer of first insulator material acts to insulate the resistor from the conductive shield.

In a more particular embodiment the second insulating means is formed as a thin layer of second insulator material on the base substrate first surface, the thin layer covering the integrated amplifier circuit means; whereby the integrated amplifier circuit is insulated by the layer of second insulator material from the conductive shield.

In another alternative embodiment the film resistor is formed on the thin layer of first insulator material on the conductive shield top surface at a predetermined location, the location being adapted to minimize electrical path lengths to the resistor as the resistor is connected for negative feedback between the output terminal and the input terminal; whereby stray parasitic capacitance is reduced.

In yet another alternative embodiment, the base substrate further comprises, a plurality of vertically diffused, degeneratively doped, shield regions, these shield regions being electrically coupled to the reference potential and which are adapted to form a discontinuous perimeter enclosing a region of near intrinsic semiconductor material, the integrated amplifier circuit means being formed within the region of near intrinsic semiconductor material, whereby the shield regions reduce the stray parasitic capacitance; thereby increasing the shielded amplifier uniform gain over a predetermined bandwidth and reducing the audio susceptibility.

In yet another alternative embodiment, the second insulating means is formed as a thin layer of second insulator material on the base substrate first surface, the thin layer covering the integrated amplifier circuit means; whereby the integrated amplifier circuit is insulated by the thin layer of second insulator material from the conductive shield.

Another more particular alternative embodiment further comprises means for attaching the conductive shield bottom surface to the surface of the substrate thin layer of second insulating material, the conductor shield being positioned on the second insulating material surface to minimize electrical path lengths from the output terminal to the resistor and from the resistor to the input terminal whereby parasitic capacitance is minimized.

Another more particular alternative embodiment comprises, a first and second lead and wherein the resistor further comprises, a first terminal and a second terminal, and wherein the resistor first terminal is positioned in close relation with the input terminal, the resistor first terminal being connected to the input terminal by the first lead and the resistor second terminal is positioned in close relation with the output terminal, the resistor second terminal being connected with the amplifier output terminal by the second lead, the leads being short to minimize parasitic capacitance.

In another most particular alternative embodiment, the integrated circuit amplifier is adapted to operate with a high impedance signal source having a source impedance in excess of $10^{+12}$ ohms and the resistor has an impedance in excess of $10^{+10}$ ohms.

In another most particular embodiment, the first insulating means is a layer of $SiO_2$ having a predetermined thickness and being formed on the conductive shield whereby the $SiO_2$ acts to insulate the resistor from the conductive shield. In another alternative embodiment the second insulating means is formed as a thin layer of silox on the base substrate first surface, the thin layer covering the integrated circuit amplifier means, the second insulating means being masked to expose the input and output terminals. In a most particular alternative preferred embodiment, the shielded amplifiers are formed on the base substrate, the base substrate being made of silicon or quartz, the shielded amplifier being located as elements in array format, the array having the elements positioned at predetermined locations in ordered rows and columns.

BRIEF DESCRIPTION OF THE DRAWINGS

The invention will be further described as to an illustrative embodiment in conjunction with the accompanying drawings in which.

DESCRIPTION OF THE PREFERRED EMBODIMENT

Figure 1:
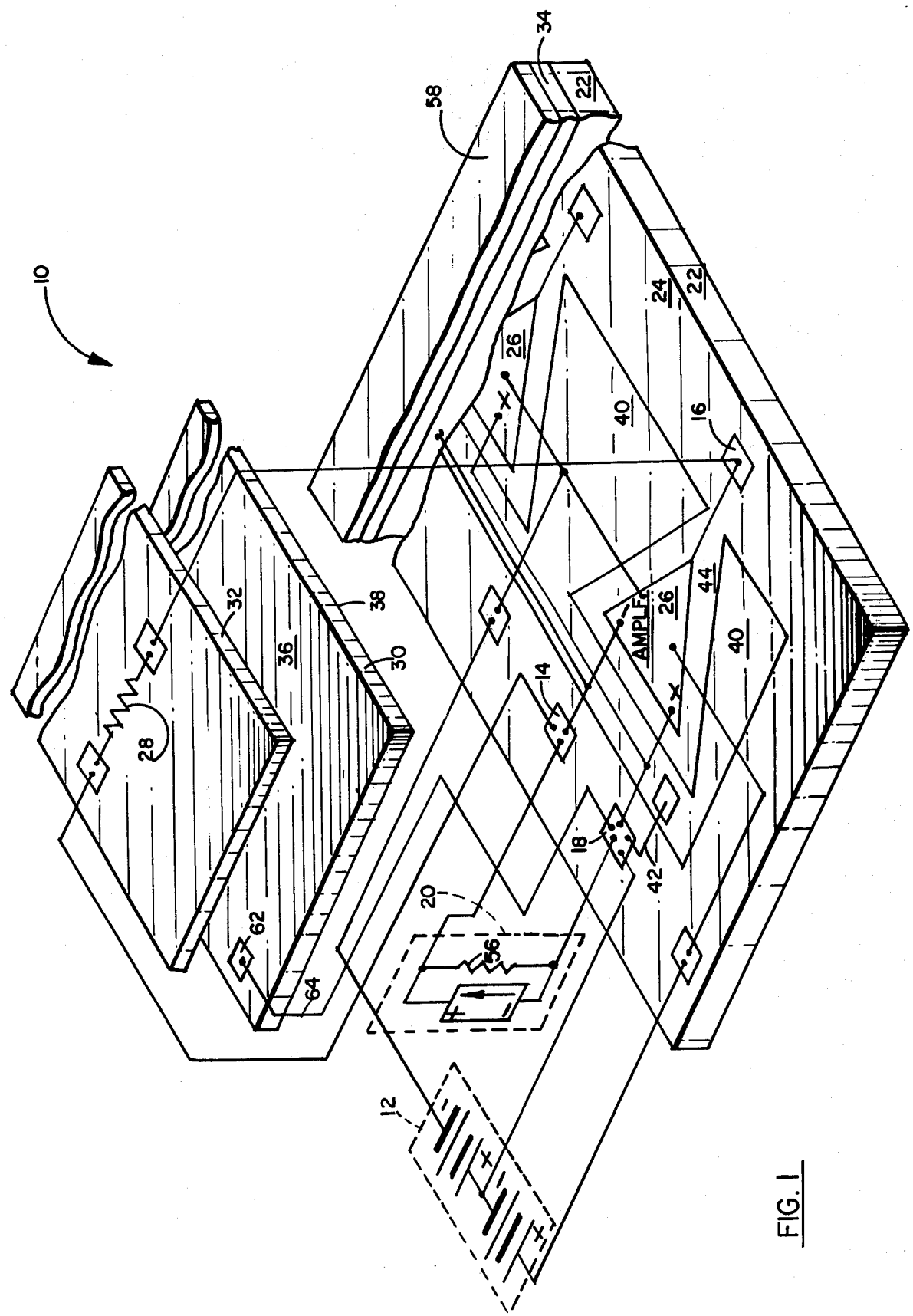
FIG. 1 is a perspective view of the invention shielded amplifier.

Referring to FIG. 1, there is shown in perspective view a preferred embodiment of the invention shielded amplifier 10 adapted for connection to a power source 12 and having an input terminal 14 and an output terminal 16 and being referenced to a reference potential at reference terminal 18, the shielded amplifier 10 being further adapted to receive a signal output from a high impedance signal source 20 referenced to the reference potential, the shielded amplifier 10 being required to amplify the signal with relatively uniform gain over a predetermined bandwidth with low audio susceptibility, and to output the amplified signal at the output terminal 16 and wherein the bandwidth and audio susceptibility are subject to substantial degradation due to stray parasitic capacitance, the shielded amplifier comprising: a substantially planar base substrate 22 of semiconductor material having a first surface 24, the input and output terminals 14, 16 being formed on the first surface, and an integrated amplifier circuit means 26 formed on the first surface 24, for amplifying the signal at the input terminal 14 and coupling the amplified signal to the output terminal 16, a resistor 28 connected for negative feedback between the output terminal 16 and the input terminal 14, a conductive shield 30 interposed between the resistor 28 and the integrated amplifier circuit means 26, the conductive shield 30 being electrically coupled to the reference potential at terminal 18, a first insulating means 32 for electrically insulating the resistor 28 from the conductive shield 30, a second insulating means 34 for insulating the conductive shield 30 from the integrated circuit amplifier means 26. The conductive shield 30 is disposed to reduce stray parasitic capacitance thereby increasing the shielded amplifier uniform gain over a predetermined bandwidth and to reduce signal cross coupling between adjacent integrated circuit amplifier means.

The conductive shield has a top surface 36 and a bottom surface 38, the first insulating means 32 being formed as a thin layer of first insulator material on the top surface 36; whereby the thin layer 32 of first insulator material acts to insulate the resistor from the conductive shield 30.

The second insulating means 34 is formed as a thin layer of second insulator material on the base substrate first surface 24, the thin layer covering the integrated amplifier circuit means 26.

The resistor is typically a thin film resistor, or a chip resistor, formed on a thin layer 32 of first insulator material on the conductive shield top surface 36 at a predetermined location, the location being adapted to minimize electrical path lengths to the resistor 28 as the resistor is connected for negative feedback between the output terminal 16 and the input terminal 14; whereby stray parasitic capacitance is reduced.

The base substrate 22 further comprises, a plurality of vertically diffused, degeneratively doped, shield regions 40. The shield regions 40 are electrically coupled to the reference potential at terminal 18 by conductor 42. The shield regions 40 are adapted to form a discontinuous perimeter enclosing a region 44 of near intrinsic semiconductor material, the integrated amplifier circuit means 26 being formed within the region 40 of near intrinsic semiconductor material. The shield region 40 operates to reduce the stray parasitic cross coupling capacitance; thereby increasing the shielded amplifier uniform gain over a predetermined bandwidth.

Signal source 20 is depicted as an optically dependent current source operating in parallel with an equivalent shunt resistance and connected between amplifier input terminal 14 and reference terminal 18. Conductive shield 30 is connected to reference terminal 18 by lead 64 from terminal 62. The signal source 20 is typically a low-level source providing an output signal current in response to an optical signal ranging from $10^{-13}$ to $10^{-10}$ ampers.

Figure 2:
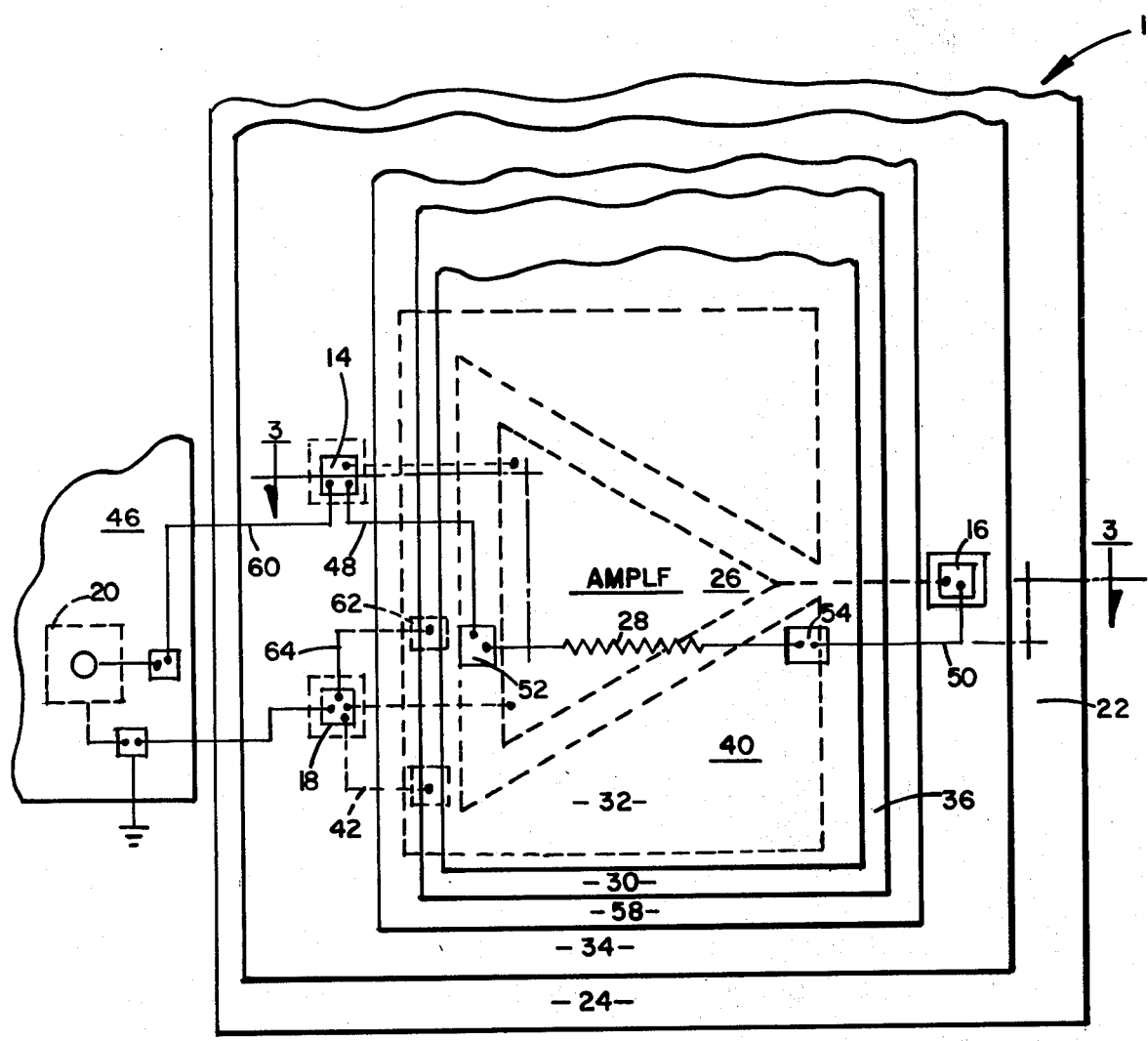
FIG. 2 is a plan view of the invention shielded amplifier.

Referring to FIG. 2, the invention shielded amplifier 10 is depicted in a plan view on substrate 22 having first surface 24, input terminal 14 and output terminal 16. Conductive shield 30 is shown covering integrated amplifier circuit means 26 and degeneratively doped, shield regions 40. Resistor 28 is on first insulating means thin layer 32 of first insulator material. High impedance signal source 20 is on detector substrate 46. Reference terminal 18 is shown connected by lead 42 to degeneratively doped region 40.

Figure 3:
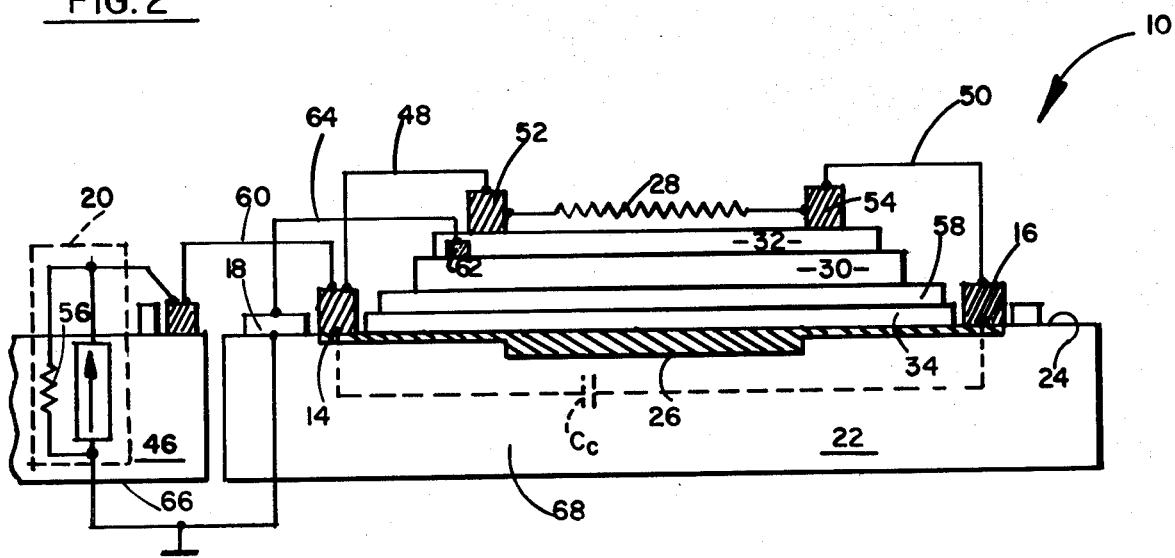
FIG. 3 is a sectional view along lines 3 of the invention shielded amplifier.

Referring to FIG. 3 the integrated circuit amplifier 26 is depicted as diffused into base substrate first surface 24.

The first insulating means 32 is typically a layer of $SiO_2$ having a predetermined thickness and being formed on the conductive shield 30 whereby the $SiO_2$ acts to insulate the resistor 28 from the conductive shield 30.

The second insulating means 34 is typically formed as a thin layer of silox on the base substrate first surface 24, the thin layer covering the integrated circuit amplifier means 26, the second insulating means being masked to expose the input terminal 14, the reference terminal 18 and the output terminal 16.

The resistor first terminal 52, being positioned in close relation with the input terminal 14, is connected to the input terminal 14 by the first lead 48. The resistor second terminal 54, being positioned in close relation with the output terminal 16, is connected to the amplifier output terminal 16 by the second lead 50.

Control capacitance Cc is shown in phantom, being diffused into integrated amplifier circuit means 26 and connecting input terminal 14 to output terminal 16. Conductive shield 30 is whown having terminal 62 and connecting lead 64 for connection to reference terminal 18.

Detector substrate 46 is typically butted up against base substrate 22 to diminish lead lengths such as lead 60 from amplifier input terminal 14. Detector substrate 46 lower surface 66 and base substrate 22 lower surface 68 are typically attached by a thin layer of adhesive, not shown, to a common surface cooled to cryogenic temperatures. Detector substrate 46 and base substrate 22 typically operate in a dewar chamber. The number of conductor leads to the shielded amplifier 10 are minimized to limit the amount of heat loss through the required conductors.

Figure 4A:
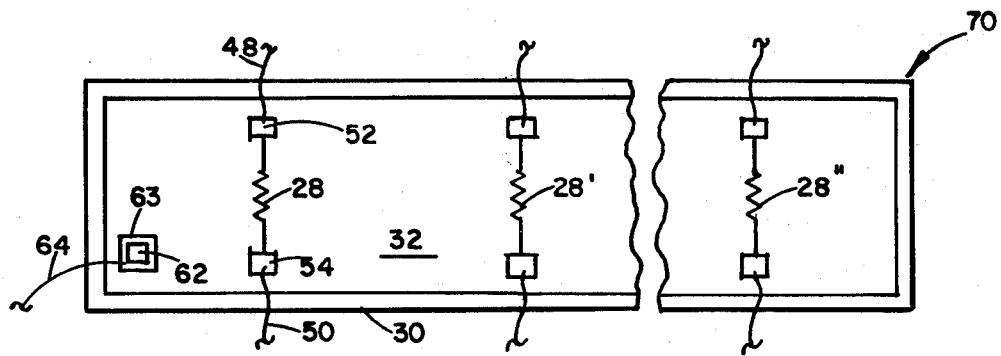
FIG. 4a is a plan view of the resistor substrate.

Referring to FIG. 4A, resistor substrate 70 is shown as a separate subassembly having a plurality of negative feedback resistors 28, 28' ... 28" ... ' preformed at predetermined locations and adapted for connection to respective amplifiers. Resistor 28 is formed between terminals 52 and 54. Leads 48 and 50 are connected to these terminals for connection to terminals 14 and 16, not shown. Lead 64 is connected through etched opening 63 to terminal 62 for contact with conductive shield 30. Lead 64 is also connected to reference terminal 18, not shown.

Figure 4B:
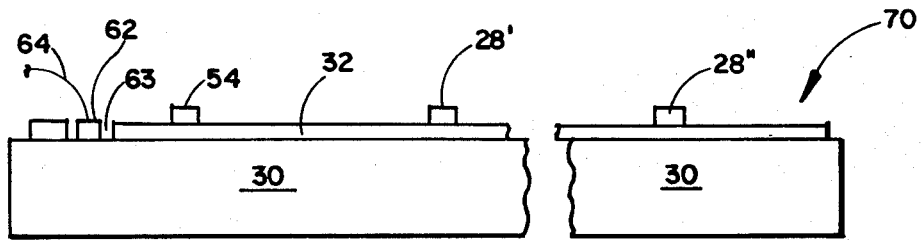
FIG. 4b is a side view of the resistor substrate.

FIG. 4B is a side view of resistor substrate 70, depicting schematically, the relative thickness of first insulating means thin layer 32 and conductive shield 30.

Thin layer 32 is typically grown on conductive shield 30 to a thickness of one micrometer. Conductive shield 30 is typically of silicon and having a thickness in excess of two hundred micrometers. Conductive shield 30 is typically made conductive by degeneratively doping the silicon of which it is made. The resistor substrate 70, is attached with a thin layer 58 of adhesive, such as an epoxy preform, to second insulating means layer 34.

Figure 5:
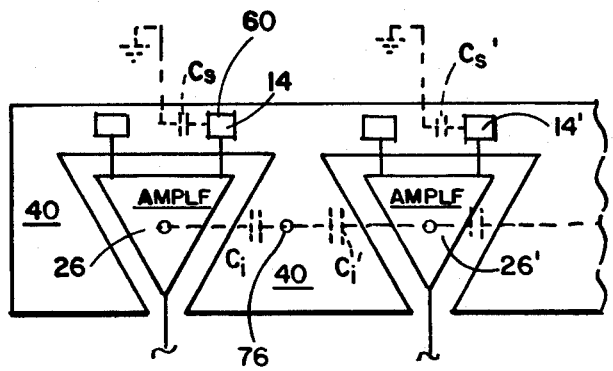
FIG. 5 is a plan view of the base substrate schematically showing stray cross coupling capacitance Ci and stray shunt capacitance Cs in phantom.

Referring to FIG. 5 integrated amplifier circuit means 26 and 26' are depicted shielded by degeneratively doped shield region 40 and having stray capacitance Ci and Ci' cross coupling the two stages. Shield region 40 provides termination 76 for each of these capacitors effectively eliminating the cross coupling due to capacitors Ci and Ci'. Stray shunt capacitance Cs and Cs' are shown in phantom connected between amplifier input terminals 14 and ground and correspondingly input terminal 14' and ground. Minimizing stray shunt capacitance is critical in the design of sub-audio low level amplifiers to prevent the amplification of amplifier input noise as a function of increasing frequency beyond the audio range. The stray shunt capacitance Cs is minimized by minimizing the lead length from amplifier input terminal 14 via lead 60 to the respective detector output.

Figure 6:
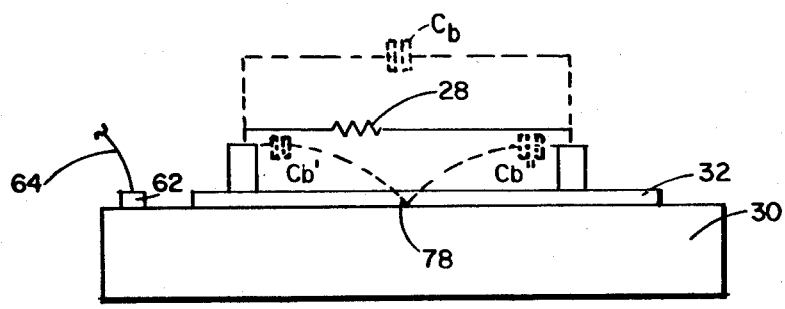
FIG. 6 is an end view of the resistor substrate schematically showing stray bridging capacitance Cb, Cb' and Cb" in phantom.

Referring to FIG. 6, phantom stray bridging capacitance Cb shunts resistor 28. Lower stray bridging capacitance Cb' and Cb" are depicted being grounded at termination 78 on conductive shield 30 effectively eliminating the effect of bridging capacitance in shunt with the resistor 28. In practice, stray bridging capacitance was limited to 0.005 pF by the invention shielded amplifier. Typical resistor technology at the resistance value required would produce approximately 1.0 pF of stray bridging capacitance. This much capacitance would make the amplifier design inoperative for the bandwidth and the negative feedback resistance value required. Lead 64 is connected to terminal 62 and to reference terminal 18 to provide an electrical reference for conductive shield 30.

The invention shielded amplifier operates as an element included in a plurality of identical shielded amplifiers, the amplifiers being formed on the base substrate 22 on 16 mil centers as elements in array format, the array having the elements positioned at predetermined locations in ordered rows and columns. The amplifier operates with signal levels that are so small as to make amplifier noise a consideration of paramount importance. The upper limit of negative feedback resistance that is used is $1.6$ times $10^{+10}$ ohms. This value was selected because it was physically realizable and because a larger value would produce thermal noise likely to mask necessary signal information.

The gain of the amplifier is increased by increasing the value of the negative feedback resistor 28; however, as the resistance of the negative feedback resistor is increased, to obtain a higher closed loop gain, the break frequency or bandwidth of the shielded amplifier is decreased. The break frequency is dependent on the value of the negative feedback resistor 28 and the value of the bridging capacitance in parallel with the negative feedback resistor 28. The value and tolerance of the resistor 28 coupled with the value and tolerance of the bridging capacitance control the ability to match the gain and bandwidth of amplifiers operating in an array.

The resistor 28 is a thin film tantalum nitride resistor capable of realizing very high sheet resistance with a fine strip width. These resistors are laser trimmed to a nominal value with a tolerance $\pm 20\%$ at temperatures below 12 K.

Having established the value of resistor 28, the invention shielded amplifier bandwidth is controlled by forming a known value of control capacitance Cc onto base substrate 22 and connected between amplifier 26 input terminal 14 and output terminal 16, and having a value sufficient to swamp the stray bridging capacitance Cb. The invention shielded amplifier typically uses a control capacitance of 0.02 pF to yield a break frequency of 400 Hz.

The amplifier means 26 is typically an integrated amplifier circuit means formed of FET transistors, that is adapted to operate with a high impedance signal source 20 having a source impedance in excess of $10^{+10}$ ohms and typically in excess of $10^{+12}$ ohms.

There is thus provided a shielded amplifier particularly adapted for use with an infrared detector array mounted on a focal plane and operating in a cryogenically cooled environment. This invention shielded amplifier is intended to interface with a signal source having a super-high impedance resulting in high sensitivity to stray parasitic capacitance, and to bridging capacitance in parallel with the amplifiers negative feedback resistor. The invention amplifier provides a shielded perimeter around and between respective shielded amplifier circuits thereby minimizing signal cross coupling between individual amplifier circuits. In addition the invention shielded amplifier provides a structure enabling the design of arrays of amplifiers having high gain and extended bandwidth.

The description provided is intended to be illustrative only and is not intended to limitative. Those skilled in the art may conceive of modifications to the figures disclosed. However, any such modifications which fall within the purview of the description are intended to be included therein as well. The scope of this invention shall be determined from the scope of the following claims including their equivalents.

What is claimed is:

1. A shielded amplifier adapted for connection to a power source and having an input terminal and output terminal and being referenced to a reference potential, said shielded amplifier being further adapted to receive a signal from a high impedance signal source referenced to said reference potential, said shielded amplifier being required to amplify said signal with relatively uniform gain over a predetermined bandwidth and to output said amplified signal at said output terminal and wherein said bandwidth is subject to substantial degradation due to stray parasitic capacitance, said shielded amplifier comprising:
   a substantially planar base substrate of semiconductor material having a first surface, said input and output terminals being formed on said first surface;
   an integrated amplifier circuit means formed on said first surface, for amplifying said signal present at said input terminal and to provide an amplified signal to said output terminal;
   a resistor connected for negative feedback between said output terminal and said input terminal;
   a conductive shield interposed between said resistor and said integrated amplifier circuit means, said conductive shield being electrically coupled to said reference potential;
   a first insulating means for electrically insulating said resistor from said conductive shield;
   a second insulating means for insulating said conductive shield from said integrated circuit amplifier means;
   wherein said conductive shield is disposed to reduce stray parasitic capacitance thereby increasing said shielded amplifier uniform gain over a predetermined bandwidth.

2. The shielded amplifier of claim 1, wherein said conductive shield has a top and bottom surface, said first insulating means being formed as a thin layer of first insulator material on said top surface; whereby said thin layer of first insulator material acts to insulate said resistor from said conductive shield.

3. The shielded amplifier of claim 1, wherein said second insulating means is formed of as a thin layer of second insulator material on said base substrate first surface, said thin layer covering said integrated amplifier circuit means; whereby said integrated amplifier circuit is insulated by said thin layer of second insulator material from said conductive shield.

4. The shielded amplifier of claim 2, wherein said resistor is a film resistor, formed on said thin layer of first insulator material on said conductive shield top surface at a predetermined location, said location being adapted to minimize electrical path lengths to said resistor as said resistor is connected for negative feedback between said output terminal and said input terminal; whereby stray parasitic capacitance is reduced.

5. The shielded amplifier of claim 1, wherein said base substrate further comprises,
   a plurality of vertically diffused, degeneratively doped, shield regions, said shield regions being electrically coupled to said reference potential and which are adapted to form a discontinuous perimeter enclosing a region of near intrinsic semiconductor material said integrated amplifier circuit means being formed within said region of near intrinsic semiconductor material, whereby said shield regions reduce said stray parasitic capacitance; thereby increasing said shielded amplifier uniform gain over a predetermined bandwidth.

6. The shielded amplifier of claim 4, wherein said second insulating means is formed of as a thin layer of second insulator material on said base substrate first surface, said thin layer covering said integrated amplifier circuit means; whereby said integrated amplifier circuit is insulated by said thin layer of second insulator material from said conductive shield.

7. The shielded amplifier of claim 6, further comprising means for attaching said conductive shield bottom surface to the surface of said substrate thin layer of second insulating material, said conductor shield being positioned on said second insulating material surface to minimize electrical path lengths from said output terminal to said resistor and from said resistor to said input terminal whereby parasitic capacitance is minimized.

8. The shielded amplifier of claim 7, wherein said base substrate further comprises,
   a plurality of vertically diffused, degeneratively doped, shield regions, said shield regions being electrically coupled to said reference potential and which are adapted to form a discontinuous perimeter enclosing a region of near intrinsic semiconductor material said integrated amplifier circuit means being formed within said region of near intrinsic semiconductor material, whereby said shield regions reduce said stray parasitic capacitance; thereby increasing said shielded amplifier uniform gain over a predetermined bandwidth.

9. The shielded amplifier of claim 8, further comprising, a first and second lead, and wherein said resistor further comprises,
   a first terminal and,
   a second terminal, and
   wherein said resistor first terminal is positioned in close relation with said input terminal, said resistor first terminal being connected to said input terminal by said first lead and said resistor second terminal is positioned in close relation with said output terminal, said resistor second terminal being connected with said amplifier output terminal by said second lead, whereby said leads are short and minimize parasitic capacitance.

10. The shielded amplifier of claim 9, wherein the integrated amplifier circuit means is adapted to operate with a high impedance signal source having a source impedance in excess of $10^{+10}$ ohms and said resistor has a source impedance in excess of $10^{+9}$ ohms.

11. The shielded amplifier of claim 9, wherein said first insulating means is a layer of $SiO_2$ having a predetermined thickness and being formed on said conductive shield whereby said $SiO_2$ acts to insulate said resistor from said conductive shield.

12. The shielded amplifier of claim 9, wherein said second insulating means is formed as a thin layer of silox on said base substrate first surface, said thin layer covering said integrated circuit amplifier means, said second insulating means being masked to expose said input and output terminals.

13. The shielded amplifier of claim 12, wherein said first insulating means is a layer of SiO$_2$ having a predetermined thickness and being formed on said conductive shield whereby said SiO$_2$ acts to insulate said resistor from said conductive shield.

14. The shielded amplifier of claim 13, wherein said high impedance signal source has a source impedance in excess of $10^{+11}$ ohms and said resistor has a source impedance in excess of $10^{+9}$ ohms.

* * * * *